United States Patent
Tobita et al.

(10) Patent No.: US 6,761,842 B2
(45) Date of Patent: Jul. 13, 2004

(54) HEAT CONDUCTIVE MOLD AND MANUFACTURING METHOD THEREOF

(75) Inventors: Masayuki Tobita, Tokyo (JP); Shinya Tateda, Tokyo (JP); Tsunehisa Kimura, Hachioji (JP); Masahumi Yamato, Chohu (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 10/370,301

(22) Filed: Feb. 18, 2003

(65) Prior Publication Data

US 2003/0153665 A1 Aug. 14, 2003

Related U.S. Application Data

(62) Division of application No. 09/733,559, filed on Dec. 8, 2000, now abandoned.

(30) Foreign Application Priority Data

Dec. 17, 1999 (JP) .......................................... 11-358646

(51) Int. Cl.$^7$ ........................... B29C 35/08; H05B 6/00; C08K 3/38
(52) U.S. Cl. ...................... 264/43.5; 264/425; 264/494; 524/404
(58) Field of Search ................................ 264/435, 425, 264/494; 524/404

(56) References Cited

U.S. PATENT DOCUMENTS

| | | | | |
|---|---|---|---|---|
| 4,008,055 A | * | 2/1977 | Phaal | .......................... 51/298 |
| 4,626,371 A | * | 12/1986 | Ikenaga et al. | .......... 252/62.54 |
| 6,054,520 A | * | 4/2000 | Washio et al. | .............. 524/404 |
| 2002/0050585 A1 | * | 5/2002 | Masayuki et al. | .......... 252/500 |

* cited by examiner

Primary Examiner—Tae H. Yoon
(74) Attorney, Agent, or Firm—McGlew and Tuttle, P.C.

(57) ABSTRACT

A method of manufacturing a heat conductive molded part having determined heat conductivity properties is provided. The method includes providing a polymer composition containing boron nitride powder. A magnetic field is impressed to the polymer composition containing boron nitride powder, field orienting the boron nitride powder in the polymer composition to a fixed direction. The polymer composition is set containing boron nitride powder with the boron nitride powder oriented in the polymer composition to the fixed direction. The polymer composition may also be provided containing a solvent. The solvent is removed after field orienting the boron nitride powder in the polymer composition to the fixed direction The composition is then set with the field oriented boron nitride powder after having removed the solvent.

17 Claims, 3 Drawing Sheets

(1)

(2)

composition for heat conductive mold (3)

(1)

(2)

composition for heat conductive mold (3)

magnetic line

HEAT CONDUCTIVE MOLD AND MANUFACTURING METHOD THEREOF

CROSS REFERENCE TO RELATED APPLICATION

This is a Divisional of application Ser. No. 09/733,559 filed Dec. 8, 2000, now abandoned and the entire disclosure of this prior application is considered to be part of the disclosure of the accompanying application and is hereby incorporated by reference therein.

FIELD OF THE INVENTION

The present invention concerns a heat conductive molded part (heat conductive mold) of good heat conductivity and manufacturing method thereof

BACKGROUND OF THE INVENTION

Recently, measures against the heat generated from electronic apparatuses are becoming an important issue by the high density implementation of semi-conductor package or higher integration and speed-up of LSI, following the performance enhancement, miniaturization, and weight reduction of electronic apparatuses. Ordinarily, in order to dissipate heat from heating devices, method to use printed circuit boards made of good heat conductive metals or ceramics, method to form a thermal veer hole to radiate heat in the substrate, method to use good heat conductive metals, ceramics or resins as semiconductor package material, method to interpose highly heat conductive grease or flexible heat conductive rubber sheet for the purpose of reducing the contact heat resistance between the heat source and the radiator, or between the heat source and the metallic heat conductive plate, method to use cooling fan, heat pipe or heat dissipation plate, or others are publicly known.

As such heat conductive mold requiring good thermal conductivity, molds filled with highly heat conductive aluminum oxide, boron nitride, aluminum nitride, magnesium oxide, zinc oxide, silicon carbide, quartz, aluminum hydroxide or other metal oxides, metal nitrides, metal carbides, metal hydroxides or other electric insulation fillers are used in practice.

However, the manufacturing method illustrated in the Japanese Patent Publication SHOU 62-154410 requires ultrasonic commotion machine or other special equipment or treatment processes, or use of specific boron nitride powder making the method inconvenient.

All of methods disclosed in the Japanese Patent Publication HEI 3-1 51 6 5 8, Japanese Patent Publication HEI 8-2 4 4 0 9 4, Japanese Patent Publication HEI 1 1-77795 and Japanese Patent Publication HEI 1 1-1 56 914 use flake form boron nitride powder or the like, require dies of complicated structure or extrusion molding equipment and complicated processing operations, and they were not necessarily simple manufacturing methods.

On the other hand, the Japanese Patent Publication Laid-Open No. HEI 1 1-87483 by the Applicant orients diamagnetic filler of 20Weight/m·K or more in thermal conductivity in a constant direction in polymer; however, boron nitride powder was not taken into account as diamagnetic material.

SUMMARY OF THE INVENTION

To solve these problems, we have studied seriously and found that a heat conductive mold characterized by that boron nitride powder is field oriented in a constant direction in polymer presents a good heat conductivity, a method to manufacture easily a heat conductive mold of good thermal conductivity applying the nature of boron nitride powder to orient along the magnetic power line in a magnetic field, and attained the present invention.

Namely, the present invention concerns a heat conductive mold characterized by that boron nitride powder is field oriented in a constant direction in polymer, a manufacturing method of heat conductive mold characterized by that boron nitride powder is field oriented in a constant direction in a composition by impressing magnetic field to a polymer component including boron nitride powder, and a manufacturing method of heat conductive mold characterized by that boron nitride powder is field oriented in a constant direction in a composition by impressing magnetic field to a liquid polymer component including boron nitride powder and solvent, and set after having removed the solvent.

Boron nitride powder used in the present invention is not particularly specified as for the kind of crystalline system, shape or size of powder particle, aggregation rate of powder particle, or their distribution. Concerning the crystalline system, boron nitride powder of hexagonal system, cubic system or other structures can be used. Particularly, highly crystalline boron nitride powder of hexagonal system or cubic system is preferable, because of its excellent thermal conductivity.

The particle form of boron nitride powder is not limited to flake form or flat form, but also various other forms of boron nitride powder, such as granular, massive, spherical, fiber, whisker form boron nitride powder, or ground product thereof can be used. The particle diameter of boron nitride powder is not specified; however, individual average primary diameter in the range of 0.01~100 $\mu$m, and more preferably, in the range of 1~50 $\mu$m can be used. Under 0.01 $\mu$m, it is difficult to charge in quantity, and boron nitride powder larger than 100 $\mu$m is difficult to produce, and disadvantageous in terms of price. As for the flake form boron nitride powder, it is practical to use within the range of 1~160 $\mu$m in its maximum diameter, because it can easily be blended with polymer and field oriented. Further, boron nitride powder having a structure where primary particles are aggregated can be used.

In particular, the present invention is basically different from a conventional manufacturing method of mechanical orientation using boron nitride powder an-isotropic shape and is hardly influenced by the boron nitride powder shape, because it can be field oriented in a way to increase the heat conductivity using the magnetic anisotropy proper to the boron nitride powder.

The quantity of boron nitride powder to be contained in polymer is preferably 20~400 weight parts to 100 weight parts of polymer. Less than 20 weight parts, the improvement effect of heat conductivity is small, while the content more than 400 weight parts increases the composition viscosity, reduces the fluidity, making the molding difficult and bubble inclusion inevitable, so it is not appropriate. More preferably, boron nitride powder is added by 30~300 weight parts, and still preferably, by 40~250 weight parts. Higher concentrations may also be obtained by using boron nitride powders of different particle diameter, or by surface treatment.

The kind of polymer used for the present invention is not particularly limited. According to the shape, hardness, mechanical nature, thermal nature, electric nature, durability, reliability or other required performances, thermoplastic resins, thermoplastic elastomers, setting resins, reticulated rubbers, or the like can be selected. Polymer used for charging boron nitride powder at a high concentration, polymers and polymer precursors presenting low viscosity in liquid or melt state. Also, it is preferable to reduce the viscosity of polymers or polymer precursors by dissolving with solvent, in order to increase the concentration of boron nitride powder, or to accelerate the field orientation of boron nitride powder in the magnetic field atmosphere.

Thermoplastic resins or thermoplastic elastomers used as polymer include polyethylene, polypropylene, ethylene propylene copolymer or other ethylene α olefin copolymer, polymethylpentene, PVC, polyvinylidene chloride, polyvinyl acetate, ethylene vinylacetate copolymer, polyvinyl alcohol, polyvinylacetal, polyvinylidene fluoride and polytetrafluoroethylene or other fluoric resins, polyethylene terephthalate, polystyrene, polyacrylonitrile, styrene acrylonitrile copolymer, ABS resin, polyphenylene ether and degenerated PPE resin, aliphatic and aromatic polyamides, polyimide, polyamide-imide, polymethacrylic acid and its methylester or other polymethacrylic acid esters, polyacrylic acids, polycarbonate, polyphenylene sulfide, plysulfone, polyether sulfone, polyether nitrite, polyether ketone, plyketone, liquid crystal polymer, silicone resin, ionomer or other thermoplastic resins, styrene butadiene or styrene isoprene bloc copolymer and their hydrogenated polymer and styrene base thermoplastic elastomers, olefin base thermoplastic elastomers, PVC base thermoplastic elastomers, polyester base thermoplastic elastomers, polyurethane base thermoplastic elastomers, polyamide base thermoplastic elastomers, or other thermoplastic elastomers.

Thermosetting resins and reticulated rubbers include epoxy, polyimide, bismuth imide, benzocyclo butene, phenol, unsaturated polyester, diallyl phtalate, silicone, polyurethane, polyimide silicone, thermosetting type polyphenylene, ether resin and degenerated PPE resin, natural rubber, butadiene rubber, isoprene rubber, styrene butadiene copolymer rubber, nitrite rubber, hydrogenated nitrite rubber, chloroprene, ethylene propylene rubber, chlorinated polyethylene, chlorosulphonated polyethylene, butyl rubber and butyl rubber halide, fluoric rubber, urethane rubber, silicone rubber or other reticulated rubber.

The heat conductive mold of the present invention uses preferably, at least one of these polymers selected from silicone rubber, epoxy, polyurethane, unsaturated polyester, polyimide, bismuth imide, benzocyclobutene, fluoric resin, and polyphenylene ether resin, and more preferably, at least one of these polymers selected from silicone rubber, epoxy, polyimide and polyurethane in terms of heat resistance, and electric reliability. Moreover, these polymers can be a low viscosity liquid for blending with boron nitride powder and can reduce the viscosity when heat melted, and when magnetic field is impressed, boron nitride powder is oriented easily.

For wiring board application or the like requiring low dielectric constant, dielectric tangent and characteristics in high frequency range, fluoric resin or thermosetting type polyphenylene ether resin or degenerated PPE resin, polyolefin base resin are preferable. Further, polymer alloy made of a plurality of polymers selected from these polymers may also be used. The reticulation method of thermosetting resin or reticulated rubber is not limited to thermosetting, but polymers by publicly known reticulation methods such as photo-setting, hygro-setting, or the like may also be used.

The heat conductive mold of the present invention may be used with a small amount of other heat conductive filler of spherical, powder, fiber, needle, flake or whisker form filler made of highly conductive aluminum oxide, aluminum nitride, zinc oxide, silicon carbide, aluminum hydroxide or other metal oxides, metal nitrides, metal carbides, metal hydroxides or metals, alloys, carbon, graphite, and diamond.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

The manufacturing method of heat conductive mold of the present invention characterized by that boron nitride powder is field oriented in a constant direction in a polymer is characterized by that boron nitride powder in a composition is oriented and set in a constant direction in a composition by impressing magnetic field to a polymer component including boron nitride powder. Further, it is characterized by that boron nitride powder in the composition is oriented in a constant direction in a composition by impressing magnetic field to a polymer component including boron nitride powder and solvent, and set after having removed the solvent.

Figure 1:
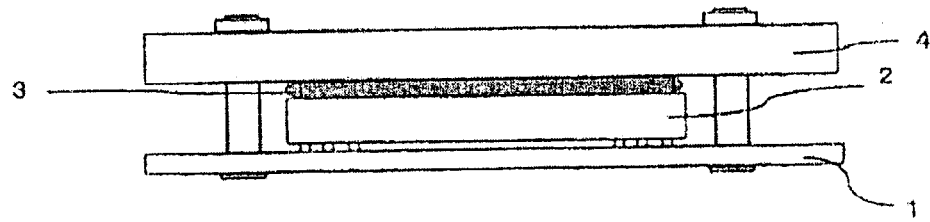
FIG. 1 is a side view showing an example of utilization of the heat conductive mold of the present invention (disposed in a gap between a ball grid array type semiconductor package 2 and a radiator 4)
Figure 2:
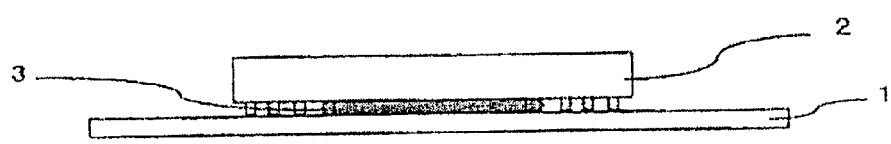
FIG. 2 is a side view showing an example of utilization of the heat conductive mold of the present invention (disposed in a gap between a chip size type semiconductor package 2 and a printed circuit board 1)
Figure 3:
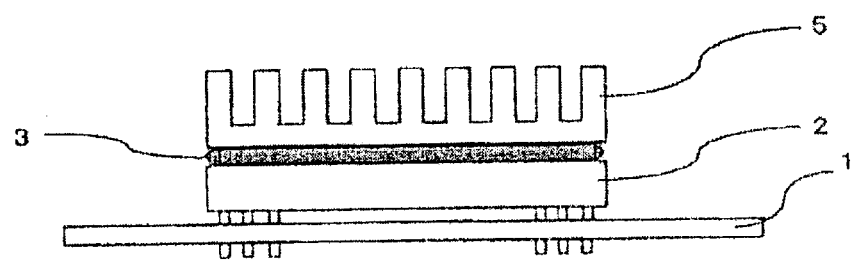
FIG. 3 is a side view showing an example of utilization of the heat conductive mold of the present invention (disposed in a gap between a pin grid array type semiconductor package 2 and a heat sink 5)
Figure 4:
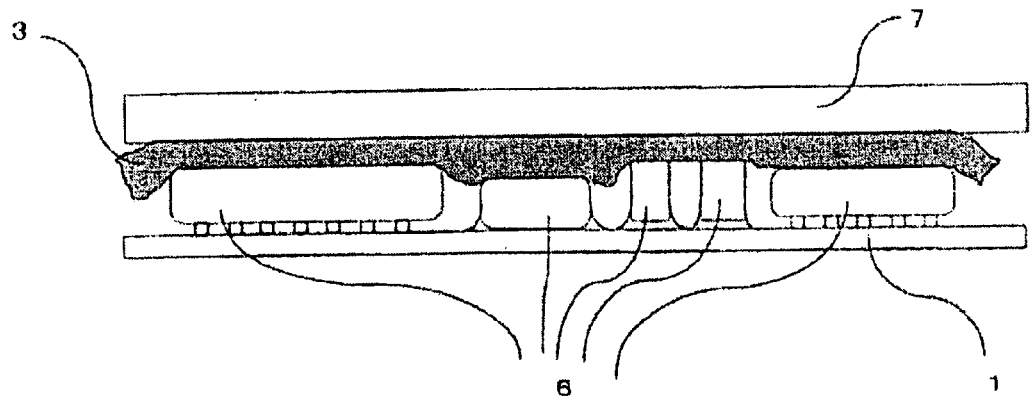
FIG. 4 is a side view showing an example of utilization of the rubber sheet shape heat conductive mold of a first embodiment of the present invention (disposed in a gap between a plurality of heating semiconductor device 6 and a case 7)
Figure 5:
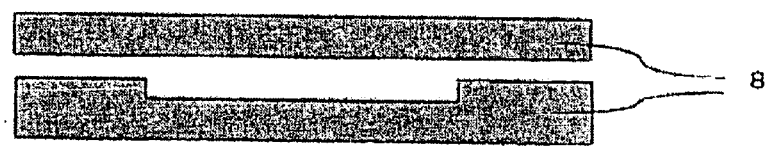
FIG. 5 is a side view showing an example of manufacturing method of the heat conductive mold of the present invention.
Figure 5:
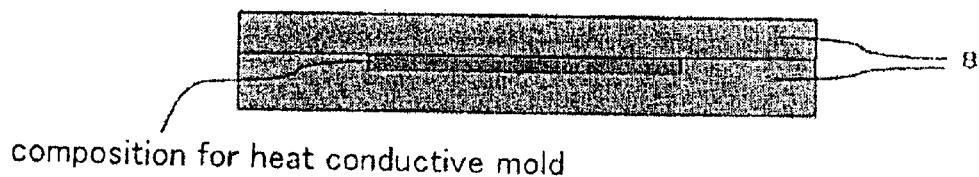
Figure 5:
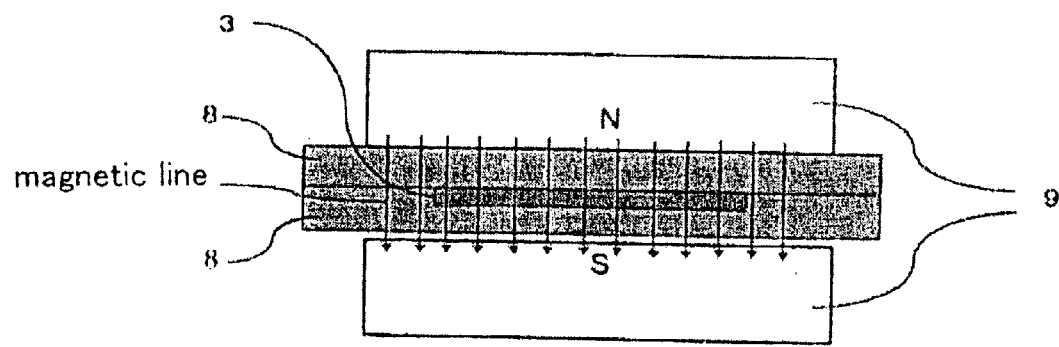
Figure 6:
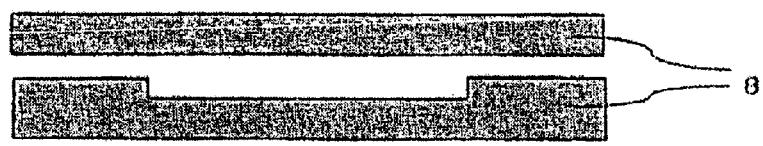
FIG. 6 is a side view showing another example of manufacturing method of the heat conductive mold of the present invention.
Figure 6:
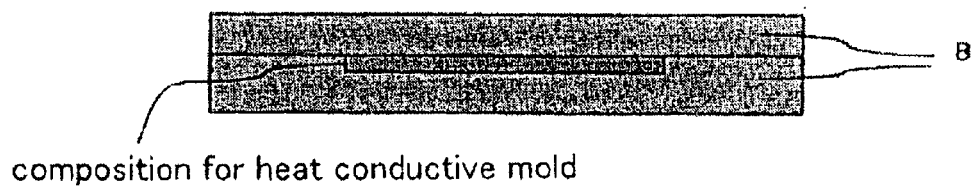
Figure 6:
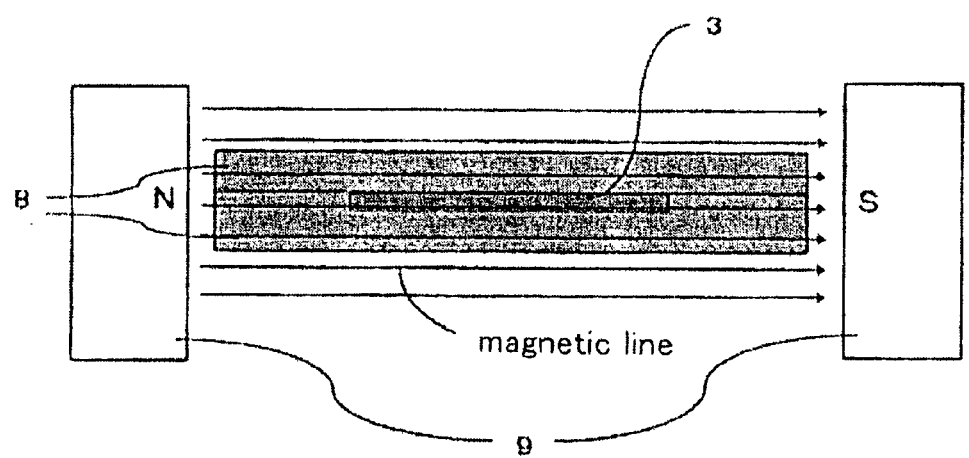

It is possible to orient boron nitride powder in a polymer composition in a fixed direction along the magnetic power line, by impressing exterior magnetic field to the composition, using the anisotropy of magnetic susceptibility of boron nitride powder, and to obtain a heat conductive mold whose heat conductivity in the fixed direction is extremely enhanced. For example, in order to align boron nitride powder in the thickness direction of sheet-shaped heat conductive mold, N pole and S pole of permanent magnet or electromagnet are opposed in the thickness direction, and disposed so that the magnetic power line corresponds to the desired orientation direction of boron nitride powder (FIG. 5). On the other hand, in order to enhance the heat conductivity in a fixed direction in the vertical direction and in the transversal direction or in the vertical and transversal horizontal directions in a plane of sheet-shaped heat conductive mold, boron nitride powder can be oriented aligned in the direction in the plane by opposing the magnet N pole and S pole vertically to the thickness direction (FIG. 6). Otherwise, boron nitride powder can also be aligned in the direction in the plane by opposing the magnet N pole and N pole, or S pole and S pole in the thickness direction. Besides, the magnetic power line is not required to be straight line, but it may be a curve, a rectangle, or two directions or more. For the sheet shaped mold, it is also possible place the magnetic power line slant to the sheet thickness, to field orient the flake form boron nitride powder in the slant direction.

The boron nitride powder magnetic field orientation method of the present invention is essentially different from the mechanical orientation method of boron nitride powder using fluid field or shearing filed of extrusion molding or press molding proposed in the prior art. In other words, it is possible to obtain a high heat conductivity by orienting boron nitride powder in an arbitrary fixed direction corresponding to the magnetic power line direction. In addition, magnets are not required to be opposed at both sides, but it is possible to field orient boron nitride powder in the raw material composition by a magnet disposed only on one side.

The magnetic field generation means used as the exterior magnetic field may be a permanent magnet, electromagnet or coil, and a flux density range from 0.05 to 30 tesla can achieve a practical orientation of boron nitride powder. As the present invention used a very weak an-isotropic magnetization rate of boron nitride powder, it is necessary to orient boron nitride powder sufficiently in a stronger magnetic filed atmosphere, and to set matrix polymer by thermosetting reaction or cooling. Preferable magnetic flux density for orientation is 0.5 tesla or more, and more preferably, 1 tesla or more.

In order to improve wetness or adhesivity between boron nitride powder and polymer, preliminary degreasing or cleaning of the boron nitride powder surface, or surface treatment by silane base, titane base, aluminum base or other ordinary coupling agents facilitate further the diffusion a blending of a quantity of boron nitride powder, and the obtained mold will have a higher heat conductivity.

The heat conductive mold of the present invention can be applied to radiation plate, radiation rubber sheet, semiconductor package component, heat sink, heat spreader, case, belt, roller, tube, tape base material, cap, profile or the like requiring a high heat conductivity. As boron nitride powder is excellent in electric insulation, the heat conductive mold of the present invention may also be applied to the wiring substrate.

FIG. 1–FIG. 4 show examples wherein the heat conductive mold 3 obtained by the present invention is interposed between heating semiconductor device 2, 6 and head conductive members, such as radiator 4, print circuit board 1, heat sink 5, or case 7.

Now, the present invention will be described more in detail based on examples. In the following examples and comparison examples, the heat conductivity was evaluated through the measurement of heat resistance value using a transistor (made by Toshiba Corp. TO-220).

EXAMPLE 1

A composition is prepared by blending 100 weight parts of added type liquid silicon rubber (made by GE Toshiba Silicon, TSE3070), 80 weight parts of hexagonal crystalline system flake form boron nitride powder (Denki Kagaku Kogyo K. K., SGP average particle diameter 19 p m) and 100 weight parts of hexane as solvent. The composition is charged into a plate shape die of 15 mm in thickness, 20 mm in length and 20 mm in width, boron nitride powder is oriented sufficiently under the magnetic field atmosphere where N pole and S pole of 2 tesla in flux density are opposed in the thickness direction, then heat dried to remove solvent hexane, and heat set, to obtain rubber sheet shape heat conductive mold of 1.5 mm in thickness. The heat resistance value of the obtained heat conductive mold was 0.26° C./W.

Comparison Example 1

A composition is prepared by blending 100 weight parts of added type liquid silicon rubber (made by GE Toshiba Silicon, TSE3070), and 80 weight parts of hexagonal crystalline system flake form boron nitride powder (Denki Kagaku Kogyo K. K., S G P average particle diameter 19 gm). The composition is charged into a plate shape die of 15 mm in thickness, 20 mm in length and 20 mm in width and heat set, to obtain rubber sheet shape heat conductive mold. The heat resistance value of the obtained heat conductive mold was 0.38° C./W.

EXAMPLE 2

A composition is prepared by blending 100 weight parts of liquid epoxy resin (made by Three Bond Co., Ltd. TB2280C) and 180 weight parts of hexagonal crystalline system granular boron nitride powder (Showa Denko Co., Ltd. U H P-EX average particle diameter 35 µm). The composition is charged into a plate shape die of 15 mm in thickness, 20 mm in length and 20 mm in width, boron nitride powder is oriented sufficiently under the magnetic field atmosphere where N pole and S pole of 6 tesla in flux density are opposed in the thickness direction, and heat set, to obtain a hard plate shape heat conductive mold as shown in FIG. 5(1), FIG. 5(2) and FIG. 5(3). The heat resistance value of the obtained heat conductive mold was 0.21° C./W.

Comparison Example 2

A composition is prepared by blending 100 weight parts of liquid epoxy resin (made by Three Bond Co., Ltd. TB2280C) and 180 weight parts of hexagonal crystalline system granular boron nitride powder (Showa Denko Co., Ltd. U H P-EX average particle diameter 35 11 µm). The composition is charged into a plate shape die of 15 mm in thickness, 20 mm in length and 20 mm in width, and heat set, to obtain a hard plate shape heat conductive mold. The heat resistance value of the obtained heat conductive mold was 0.32° C./W.

EXAMPLE 3

A composition is prepared by blending 100 weight parts of solid portion of polyimide varnish containing N methyl pyrrolidone as solvent (made by Ube Kosan Co., Ltd., Yupifine ST, concentration of solid portion 18.5%) and 60 weight parts of hexagonal crystalline system flake form boron nitride powder (made by Showa Denko Co., Ltd. UHP-S1 average particle diameter 1 to 2 µm). The composition is charged into a box die of 20 mm in length, 20 mm in width and 40 mm in depth, boron nitride powder is oriented sufficiently under the magnetic field atmosphere where N pole and S pole of 6 tesla in flux density are opposed in the thickness direction, and heat set after having removed solvent N methyl pyrrolidone, to obtain a film shape heat conductive mold of 120 µm in thickness. The heat resistance value of the obtained heat conductive mold was 0.18° C./W.

Comparison Example 3

A composition is prepared by blending 100 weight parts of solid portion of polyimide varnish containing N methyl pyrrolidone as solvent (made by Ube Kosan Co., Ltd., Yupifine ST, concentration of solid portion 18.5%) and 60 weight parts of hexagonal crystalline system flake form boron nitride powder (made by Showa Denko Co, Ltd. UHP-S1 average particle diameter 1 to 2 µm). The composition is charged into a box die of 20 mm in length, 20 mm in width and 40 mm in depth, and heat set after having removed solvent N methyl pyrrolidone, to obtain a film shape heat conductive mold of 120 μm in thickness. The heat resistance value of the obtained heat conductive mold was 0.27° C./W.

Comparison Example 1, Comparison Example 3 are conventional molds wherein flake form boron nitride powder is charged into polymer, and Comparison Example 2 is the one wherein granular boron nitride powder is charged, and they present a high heat resistance value. The heat conductive mold of Example 1, Example 2, Example 3 of the present invention are obtained by impressing magnetic field to the polymer composition containing the same amount of flake form boron nitride powder or granular boron nitride powder as the corresponding Comparison Example, field orienting boron nitride powder in the composition, and then heat setting, and it presents smaller heat resistance value and better heat conductivity than the Comparison Example.

As described above, the present invention allows to produce a heat conductive mold of excellent heat conductivity, by impressing magnetic field to the polymer composition containing flake form boron nitride powder or granular boron nitride powder, field orienting boron nitride powder in the composition to a fixed direction, and then heat setting.

Using the heat conductive mold of the present invention, various radiation components requiring a high heat conductivity such as high heat value CPU (central processing unit) or other semiconductors, power source, light source, plasma display, printed circuit board or the like can be supplied.

While specific embodiments of the invention have been shown and described in detail to illustrate the application of the principles of the invention, it will be understood that the invention may be embodied otherwise without departing from such principles.

What is claimed is:

1. A manufacturing method of a heat conductive electric insulation mold of excellent heat conductivity, the method comprising the steps of:

providing a polymer composition comprising of boron nitride powder and polymer;

impressing a magnetic field to the polymer composition containing boron nitride powder and polymer, thus field orienting the boron nitride powder in the polymer composition to a fixed direction; and setting the polymer composition containing boron nitride powder with the boron nitride powder oriented in the polymer composition to the fixed direction.

2. The manufacturing method of a heat conductive mold of claim 1, wherein the polymer composition is selected from the group consisting of silicone rubber, epoxy, polyimide and polyurethane.

3. The manufacturing method of a heat conductive mold of claim 1, wherein the content of the boron nitride powder is 20 to 400 weight parts to 100 weight parts of polymer.

4. The manufacturing method of a heat conductive mold of claim 1, wherein the boron nitride powder has a crystal structure of a hexagonal system or a cubic system.

5. The manufacturing method of a heat conductive mold of claim 1, wherein a heat resistance value in a direction in which the baton nitride powder is oriented is not more than 0.26° C./W (degree C./W).

6. A manufacturing method of a heat conductive electric insulation mold of excellent heat conductivity, the method comprising the steps of:

providing a polymer composition comprising of boron nitride powders polymer and solvent;

impressing a magnetic field to the polymer composition containing boron nitride powder, polymer and solvent to field orient the boron nitride powder in the polymer composition to a fixed direction;

removing the solvent; and setting the composition with field oriented boron nitride powder after having removed the solvent.

7. The manufacturing method of a heat conductive mold of claim 6, wherein the polymer composition is selected from the group consisting of silicone rubber, epoxy, polyimide and polyurethane.

8. The manufacturing method of a heat conductive mold of claim 6, wherein the content of the boron nitride powder is 20 to 400 weight parts to 100 weight parts of polymer.

9. The manufacturing method of a heat conductive mold of claim 6, wherein the boron nitride powder has a crystal structure of a hexagonal system or a cubic system.

10. The manufacturing method of a heat conductive mold of claim 6, wherein a heat resistance value in a direction in which the boron nitride powder is oriented is not more than 0.26° C./W (degree C./W).

11. A method of manufacturing a heat conductive molded part having determined heat conductivity properties, the method comprising:

providing a polymer composition containing boron nitride powder;

impressing a magnetic field to the polymer composition containing boron nitride powder, field orienting the boron nitride powder in the polymer composition to a fixed direction; and setting the polymer composition containing boron nitride powder with the boron nitride powder oriented in the polymer composition to the fixed direction.

12. The method according to claim 11, wherein the polymer composition is provided also containing a solvent.

13. The method according to claim 11, further comprising:

removing the solvent after field orienting the boron nitride powder in the polymer composition to the fixed direction; and setting the composition with the field oriented boron nitride powder after having removed the solvent.

14. The method according to claim 11, wherein the polymer composition is selected from the group consisting of silicone rubber, epoxy, polyimide and polyurethane.

15. The method according to claim 11, wherein the content of the boron nitride powder is 20 to 400 weight parts to 100 weight parts of polymer.

16. The method according to claim 11, wherein the boron nitride powder has a crystal structure of a hexagonal system or a cubic system.

17. The manufacturing method of a heat conductive mold of claim 11, wherein a heat resistance value in a direction in which the boron nitride powder is oriented is not more than 0.26° C./W (degree C./W).

* * * * *